US010271141B2

(12) United States Patent
Glazer

(10) Patent No.: US 10,271,141 B2
(45) Date of Patent: Apr. 23, 2019

(54) WOOFER ASSEMBLY WITH ONE WOOFER CONFIGURED TO PROVIDE MID-RANGE AUDIO FREQUENCIES

(71) Applicant: Harman International Industries, Incorporated, Stamford, CT (US)

(72) Inventor: Mark Glazer, Agoura Hills, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 63 days.

(21) Appl. No.: 15/346,098

(22) Filed: Nov. 8, 2016

(65) Prior Publication Data

US 2017/0134859 A1 May 11, 2017

Related U.S. Application Data

(60) Provisional application No. 62/252,880, filed on Nov. 9, 2015.

(51) Int. Cl.
*H03G 5/00* (2006.01)
*H04R 3/14* (2006.01)
*H04R 1/26* (2006.01)

(52) U.S. Cl.
CPC ................. *H04R 3/14* (2013.01); *H04R 1/26* (2013.01)

(58) Field of Classification Search
CPC .................................. H04R 3/04; H04R 3/14
USPC ........................................................... 381/99
See application file for complete search history.

(56) References Cited

U.S. PATENT DOCUMENTS 5,147,986 A * 9/1992 Cockrum ............ H04R 29/003 181/145
5,937,072 A * 8/1999 Combest ................. H04R 3/14 381/98
2017/0055096 A1* 2/2017 Chamness .............. H04S 5/005

* cited by examiner

*Primary Examiner* — Katherine A Faley
(74) *Attorney, Agent, or Firm* — Brooks Kushman, P.C.

(57) ABSTRACT

A speaker assembly may include a first woofer speaker electronically coupled to a first electronic circuit including high-Q filter configured to provide first audio signals having frequencies between 200-2000 Hz to the first woofer speaker. The speaker assembly may further include at least one second woofer speaker electronically coupled to a second electronic circuit configured to provide second audio signals having frequencies between 20-200 Hz to the second woofer speaker, wherein the first woofer speaker is identical to the second woofer speaker and is configured to operate as a mid-range speaker.

18 Claims, 5 Drawing Sheets

WOOFER ASSEMBLY WITH ONE WOOFER CONFIGURED TO PROVIDE MID-RANGE AUDIO FREQUENCIES

CROSS-REFERENCE TO RELATED APPLICATIONS

This application claims the benefit of U.S. provisional application Ser. No. 62/252,880 filed Nov. 9, 2015, the disclosure of which is hereby incorporated in its entirety by reference herein.

TECHNICAL FIELD

Aspects disclosed herein generally related to a speaker assembly including any number of speakers or transducers (e.g., woofer(s), tweeter(s), etc.).

BACKGROUND

Mid-range speakers are loudspeakers that typically reproduce sound in a frequency range from 200 Hz-2 kHz. Mid-range speakers are often used in three-way multi driver systems. When joining the mid-range speaker with other low frequency speakers and high frequency speakers, the mid-range speaker may affect the selection of crossover frequency and slope.

SUMMARY

One or more aspects disclosed herein may replace a dedicated midrange speaker within a speaker assembly with an additional woofer speaker. These aspects and others are disclosed below.

A speaker assembly may include a first woofer speaker electronically coupled to a first electronic circuit including high-Q filter configured to provide first audio signals having frequencies between 200-2000 Hz to the first woofer speaker. The speaker assembly may further include at least one second woofer speaker electronically coupled to a second electronic circuit configured to provide second audio signals having frequencies between 20-200 Hz to the second woofer speaker, wherein the first woofer speaker is identical to the second woofer speaker and is configured to operate as a mid-range speaker.

A three-way speaker system may include three identical woofer speakers including a first woofer speaker, a second woofer speaker, and a third woofer speaker. The first woofer speaker may be electronically coupled to a first filter configured to provide a first audio signal having mid-range frequencies between 200-2000 Hz. The second woofer speaker and the third woofer speaker each coupled to a second filter configured to provide the second woofer speaker and the third woofer speaker with a second audio signal having frequencies between 20-200 Hz.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

Figure 1:
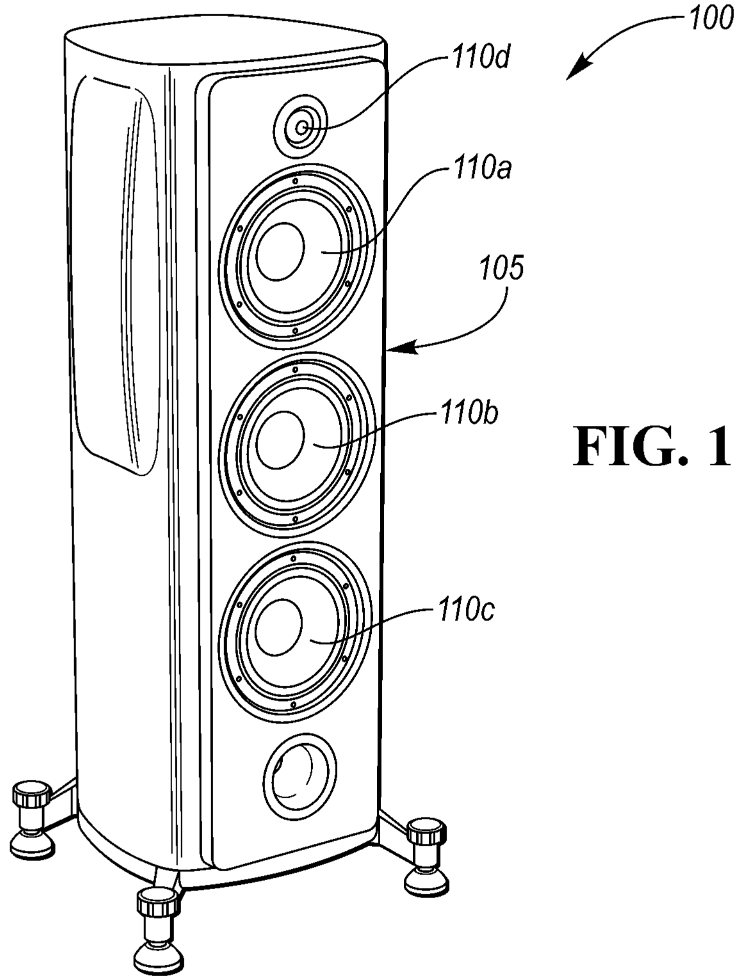
FIG. 1 depicts an example speaker system according to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices, and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein.

Three-way multi driver speakers systems often include a mid-range speaker, as well as a low frequency speaker, (often referred to as a woofer,) and a high frequency speaker, (often referred to as a tweeter). The mid-range speaker reproduces sound in the frequency range from 200-2000 Hz and therefor produces a significant portion of the audible sound spectrum, including musical instruments and human voice reproductions. Because these frequencies are familiar to the human ear, discrepancies as to the sound output from the mid-range speaker may be easily recognized by a user.

The embodiment(s) disclosed herein may replace a dedicated midrange speaker (e.g., a speaker that transmits audio at a frequency from 200-2000 Hz) with a woofer speaker (e.g., a speaker that transmits audio at a frequency from 20-200 Hz). In one example, assume that the speaker assembly includes two woofer speakers, another identical woofer (or possible a different woofer) may be utilized and coupled to a filter (i.e., that is mistuned) to provide an audio output at a frequency of between 200-2000 Hz in place of the midrange speaker. In other words, the replacement woofer acts as a midrange speaker when coupled to a simple two element crossover. The replacement woofer receives current and increases its output in the midrange frequency. The overall response may be flat and have a high sensitivity. Each woofer may have an impedance of 12 ohms, such that even with an excess midrange current, the overall system impedance may be high.

FIG. 1 illustrates an example speaker system 100 having a loudspeaker 105. The loudspeaker 105 may include a plurality of speakers 110*a-d* (collectively referred to as speakers 110). The loudspeaker 105 may include several types of speakers such as midrange speakers, tweeters, and woofers. As explained above, each type of speaker may be responsible for audio output in a specific frequency range. The loudspeaker 105 may include a first speaker 110*a*, a second speaker 110*b*, a third speaker 110*c*, and a fourth speaker 110*d*. In one example, the first speaker 110*a* may include a midrange speaker; the second speaker 110*b* and the third speaker 110*c* may each include a woofer (also referred to as the second woofer 110*b* and third woofer 110*c*, respectively), and the fourth speaker 110*d* may include a tweeter (also referred to as tweeter 110*d*).

As discussed herein, however, the first speaker 110*a* may include, instead of a midrange speaker, a first woofer (referred to herein as first woofer 110*a*). The first woofer 110*a* may be identical to the second and third woofers 110*b*, 110*c*). For instance, the first woofer 110*a* may be the same mechanical part (e.g., may be of the same size, have the same properties such as response and sensitivity, etc.) as the second and third woofers 110*b*, 110*c*. This may reduce purchasing and building costs by using the same part. Further, the first woofer 110*a* may have a same or similar cone size (e.g., diameter, area, etc.) as the second and third woofers 110*b*, 110*c*. This may result in the first, second and third woofers 110*a-c* having same sensitivity.

Additionally or alternatively, the first woofer 110*a* may differ from the second and third woofers 110*b*, 110*c*. Because woofers tend to have higher sensitivity than midrange speakers, the speaker system 100 may appreciate a higher sensitivity due to the use of a woofer in place of the mid-range speaker. For example, instead of a traditional mid-range speaker that may have a diameter of 4-5 inches, a woofer speaker with a diameter of 6 inches may be included in the speaker system 100. The additional diameter allows for a greater cone area, thus providing for a higher sensitivity speaker than that of the mid-range speaker. Additionally, using identical parts may increase efficiencies in manufacturing, as well as in purchasing, causing overall product costs to decrease. Further, a three-way complex crossover may be eliminated from the traditional 3-way speaker system, as well as additional enclosures.

Figure 2:
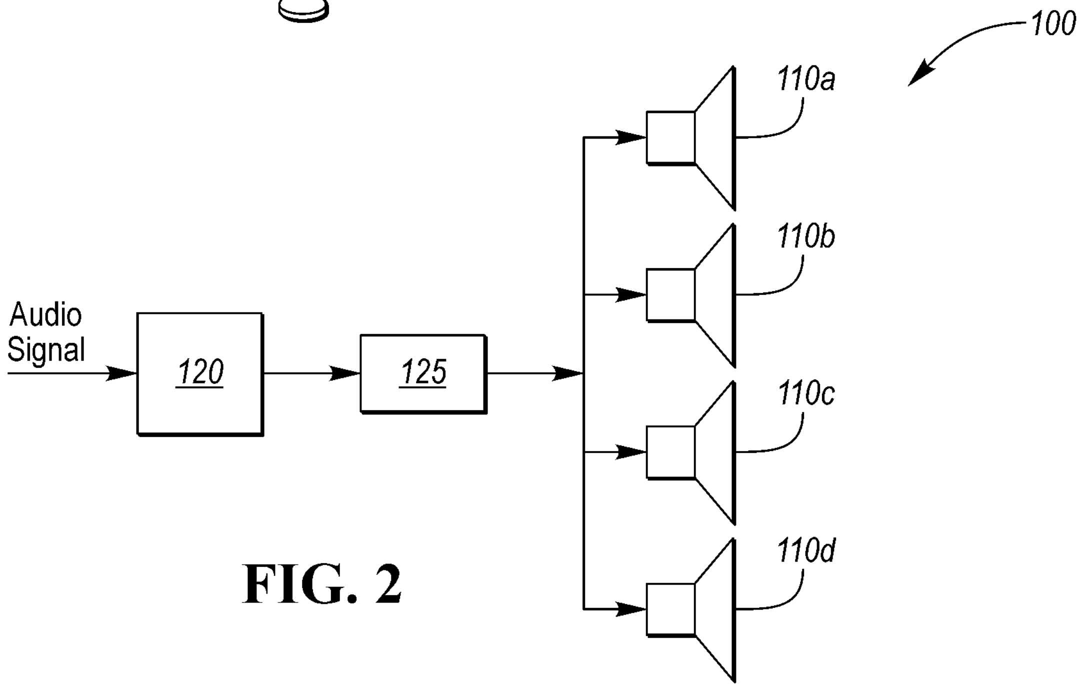
FIG. 2 depicts an example block diagram of the speaker system of FIG. 1.

FIG. 2 illustrates an example block diagram of the speaker system 100. The speaker system 100 may include the speakers 110, as described above with respect to FIG. 1. For example, the speakers 110 may include the first woofer 110*a*, the second woofer 110*b*, the third woofer 110*c*, and the tweeter 110*d*. The system 100 may also include an amplifier 120 electronically connected to a crossover 125. The amplifier 120 may be a power amplifier configured to amplify an incoming audio signal.

The crossover 125 may receive the audio signal from the amplifier 120 and may filter the audio signal into a plurality of frequency bands. The crossover 125 may then provide each frequency band to a specific speaker 110. In the example shown in FIG. 2, the crossover 125 may be implemented as a passive crossover. However, the speaker system 100 may include an active crossover. The crossover 125 may include various filters including low pass and high pass filters, as well as other types of filters such as Butterworth filters.

Each speaker 110 may include or be electronically connected to various circuits for driving the respective speaker. These circuits are discussed below with respect to FIG. 3.

Figure 3:
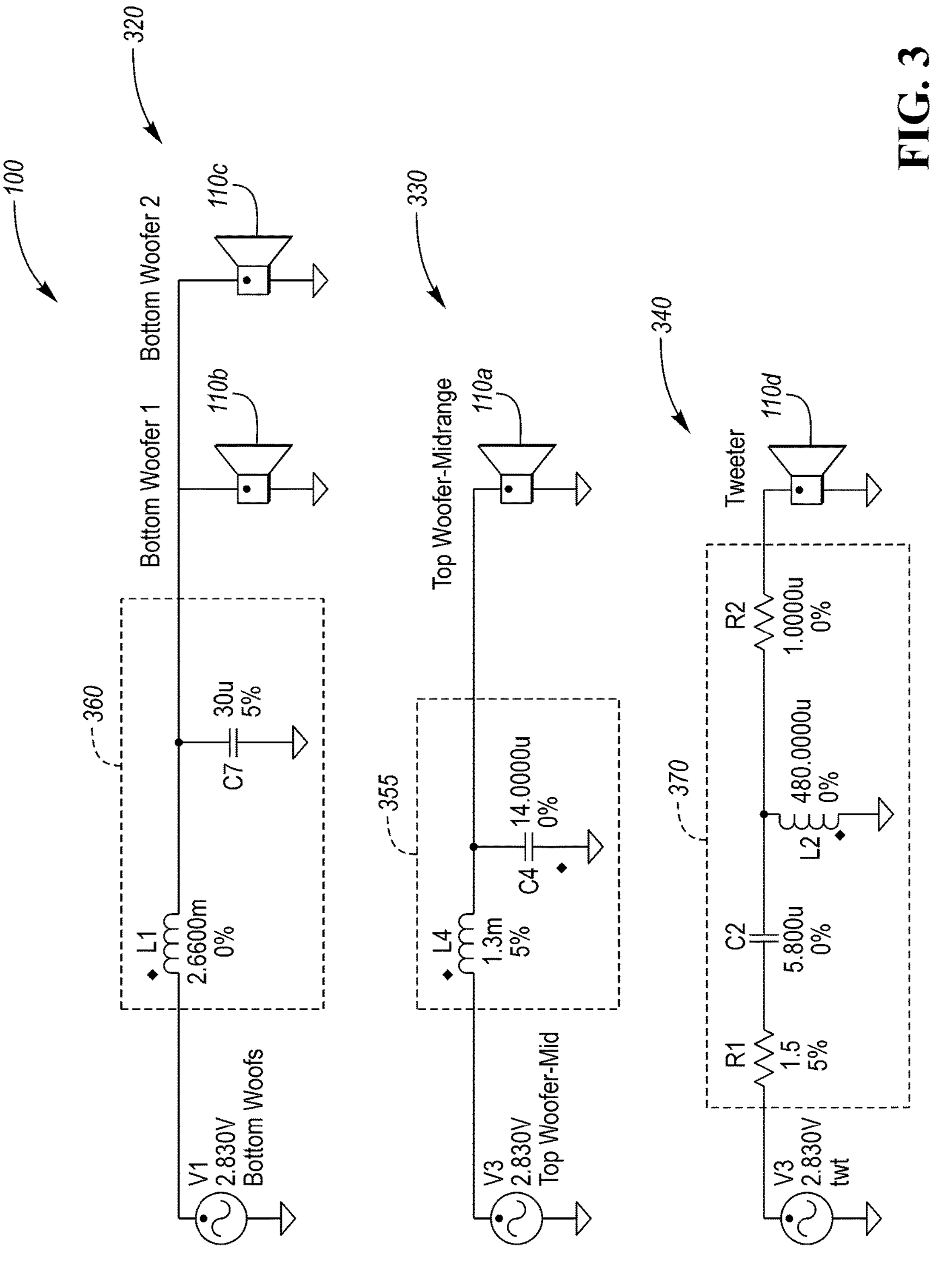
FIG. 3 depicts various circuits for driving at least one speaker in a speaker assembly in accordance to one embodiment.

FIG. 3 depicts various circuits 320, 330, and 340 for driving at least one of the speakers (e.g., speakers 110*a-d*) in the speaker system 100 in accordance to one embodiment. The speaker system 100, as explained, generally includes, but is not limited to, the first woofer 110*a*, the second woofer 110*b*, the third woofer 110*c*, and the tweeter 110*d*. The second and the third woofers 110*b*, 110*c* may each provide an audio signal in the frequency range of 20-200 Hz. The tweeter 110*d* may provide an audio signal in the frequency range of 2000-20,000 Hz. Each speaker 110 may include a respective one of the circuits 320, 330, 340. Additionally or alternatively, the crossover 125 may also include the circuits 320, 330, 340.

As generally shown at circuit 330, the first woofer 110*a* may be implemented as a top woofer of the speaker system 100. A voltage source V2 is generally arranged to provide a voltage in the amount of 2.830V or other suitable voltage. An inductor L4 and a capacitor C4 from a first filter 355. The first filter 355 may be a high-Q filter (or a mistuned HiQ filter or a narrow-band filter), for example, configured to receive the voltage from the voltage source V2. The first filter 355 may have a high filter roll-off. This may be due, at least in part, to the gain of the audio signal supplied to the first woofer 110*a* being higher than normal. In this example, the gain may be up to approximately 3 dB above the typical 0 dB amplitude. This is discussed in more detail below with respect to FIG. 4.

The inductor L4 may have a relatively low inductance value, for example, 1.3 mH. Other values may be used, however, such as 1.0 mH, etc. The capacitor C4 may have a low capacitance, for example, 14 μF. Other values may be used, however, such as 16 μF, etc. Due to the low inductance value, the first woofer 110*a* may receive an audio signal with a higher current and higher gain than that of a filter with a higher inductance value. Due to the higher current, the first woofer 110*a* may provide an audio output signal similar to that of a mid-range speaker.

In short, the voltage source V2 and the first filter 355 (e.g., inductor L4 and capacitor C4) enable the first woofer 110*a* to output the audio output signal that is generally in the midrange frequency of 2000-20,000 Hz while utilizing a woofer (e.g., the first woofer 110*a*) instead of a midrange speaker. Because a similar product may be used across three of the woofers (e.g., the first, second, and third woofers 110*a*-110*c*), costs for producing the speaker assembly 10 may be reduced.

Circuit 320 illustrates that a voltage source V1 provides a voltage to second filter 360, including an inductor L1, a capacitor C7. The second filter 360 may provide an audio signal to the second woofer 110*b* and the third woofer 110*c* (i.e., each of the second woofer 110*b* and the third woofer 110*c* may be bottom woofers in the speaker system 100). The circuit 320 generally drives the second woofer 110*b* and the third woofer 110*c* to each provide an audio output signal in the frequency range of 20 Hz-200 Hz.

The inductor L1 may have a higher inductance value than that of L4. For example, the inductor L1 may have an inductance value of 2.66 mH. The higher inductance value of circuit 320 may balance the lower inductance value of circuit 330. During operation of the speaker system 100, when a high current and high amplitude are present at the first woofer 110*a*, circuit 330 may realize a drop in impedance. In one example, a current of 8 A may be achieved with a voltage above 0 dB. A low impedance, especially an impedance below 2 ohms, for example, may affect the speaker output significantly. Because circuit 320 may realize a higher impedance due to the higher inductance value of L1 compared to the impedance value of the circuit 330, the overall system impedance may be of an acceptable range so as to not affect the acoustic output of the speakers 110.

Circuit 340 illustrates that a voltage source V3 provides a voltage to resistor R1, capacitor C2, inductor L2, resistor R2, and the tweeter 110*d*. The resistor R1, the capacitor C2, the inductor L2, and the resistor R2 generally form a third filter 370 (e.g., a high pass filter). The circuit 40 generally drives the tweeter 110*d* to provide an audio output signal in the frequency range of 2000-20,000 Hz. Any of the values depicted in the attached figures are provided as examples and may vary based on the desired criteria of a particular implementation.

Figure 4:
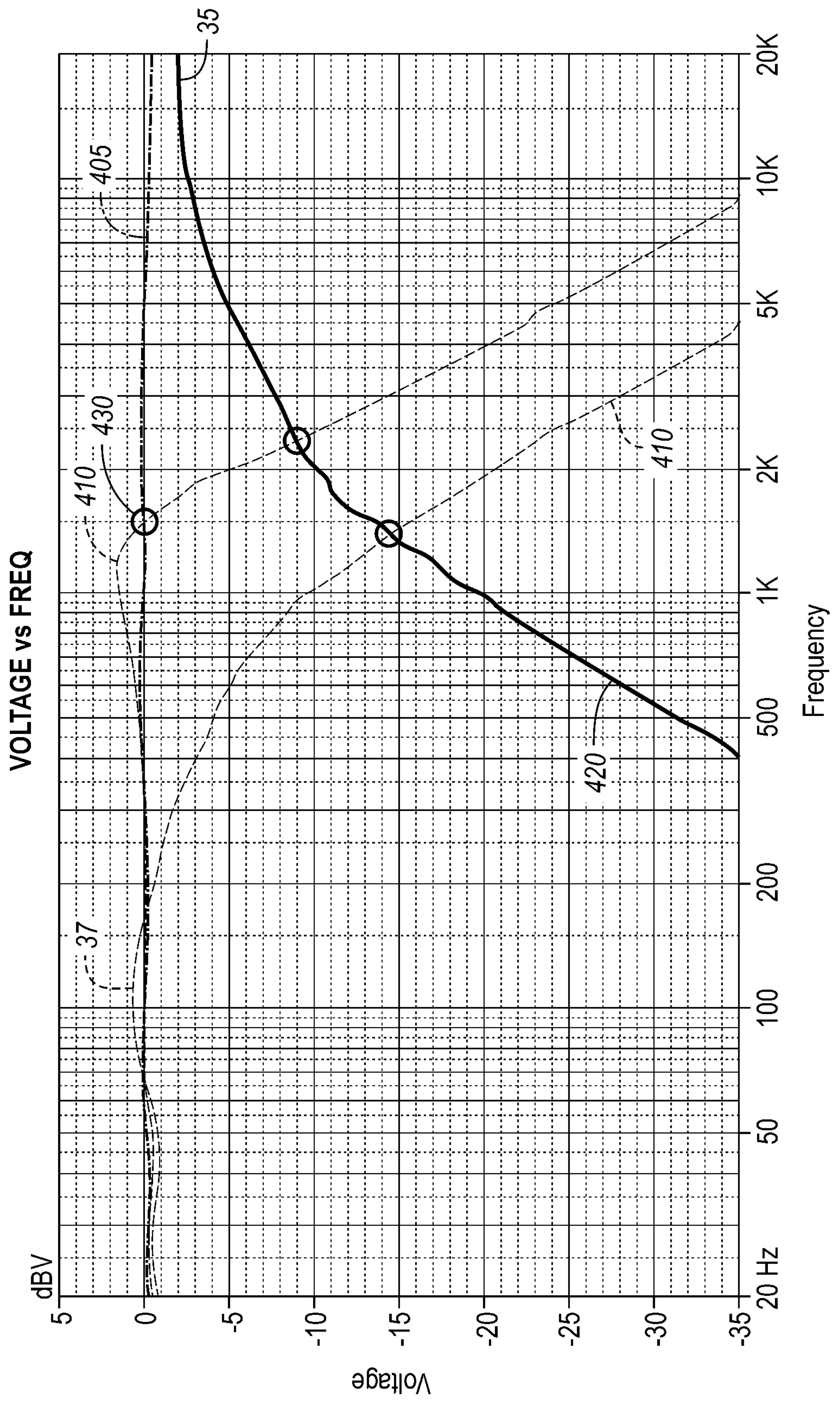
FIG. 4 depicts a plot including various waveforms that correspond to various crossover voltage curves in accordance to one embodiment.

FIG. 4 depicts a plot including various waveforms that correspond to various crossover voltage curves in accordance to one embodiment. Specifically, FIG. 4 illustrates an example plot showing a voltage vs. frequency plot for each of the speakers 110. A first curvature 405 may represent a terminal voltage of the speaker system 100. As shown, the terminal voltage may be approximately 0 dB. A second curvature 410 may represent a curvature for the first woofer 110*a*. The second curvature 410 illustrates that the voltage may exceed past the terminal gain of 0 B. This increase indicates that a higher current is being pushed to the first woofer 110*a*. This increase may be made possible by the high current being presented to circuit 330 causing a higher "Q", or higher roll-off gain, for the filter 355 of circuit 330. Because the current and gain is higher for circuit 330, a higher roll-off may be recognized. While this type of current may cause low impedance, due to the high impedance of the second and third woofers 110*b*, 110*c*, the overall sound quality of the system is not affected. A third curvature 415 may represent a curvature for the second and third woofers 110*b*, 110*c*. A fourth curvature 420 may represent a curvature for the tweeter 110*d*.

Figure 5:
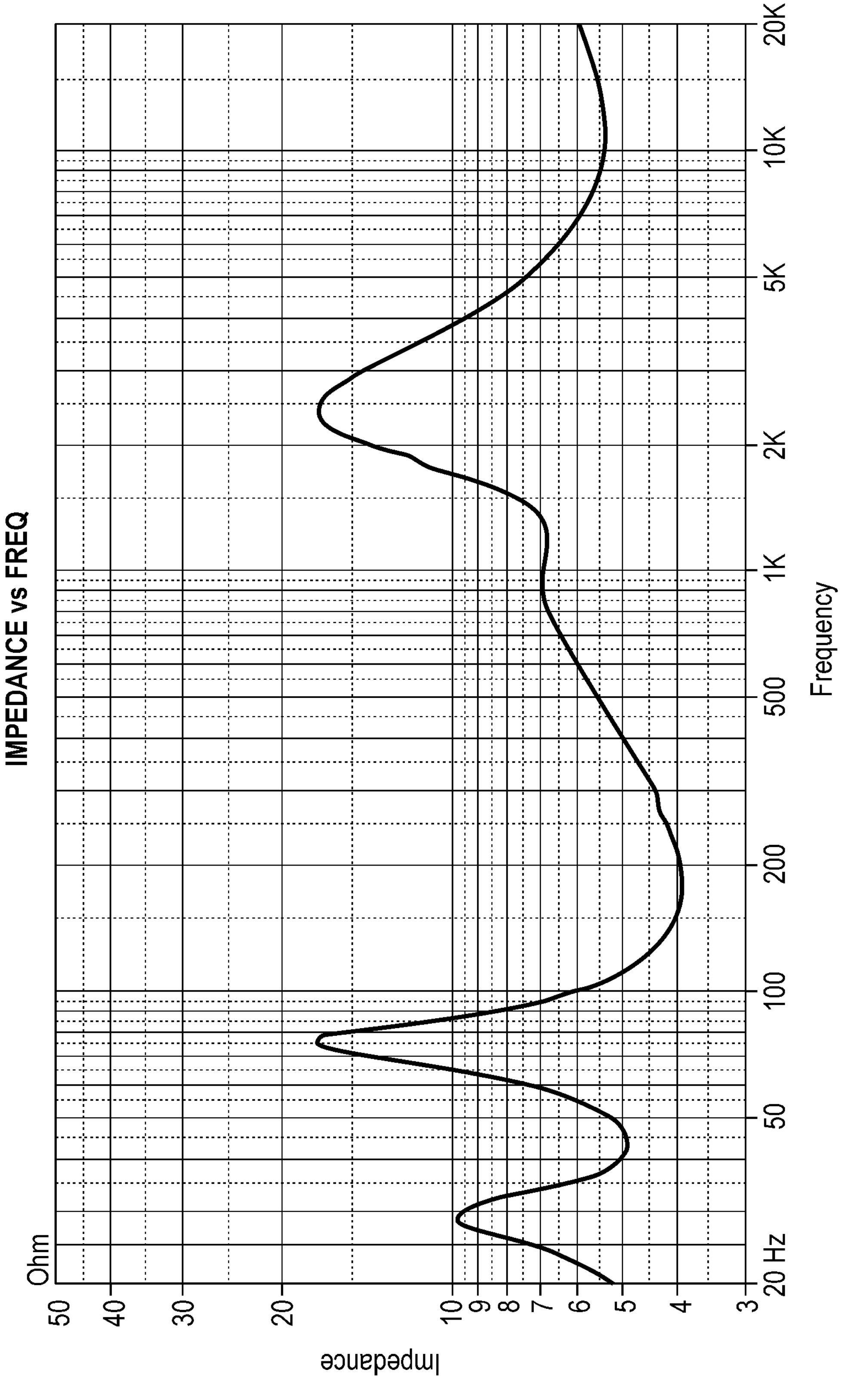
FIG. 5 depicts a plot including a waveform indicating an impedance to frequency relationship in accordance to one embodiment.

FIG. 5 depicts a plot including a waveform indicating an impedance to frequency relationship in accordance to one embodiment. Specifically, FIG. 5 illustrates overall system impedance over frequency. The impedance may vary across the various frequencies. However, as shown in FIG. 5, the impedance does not fall below 3.9 ohms.

Figure 6:
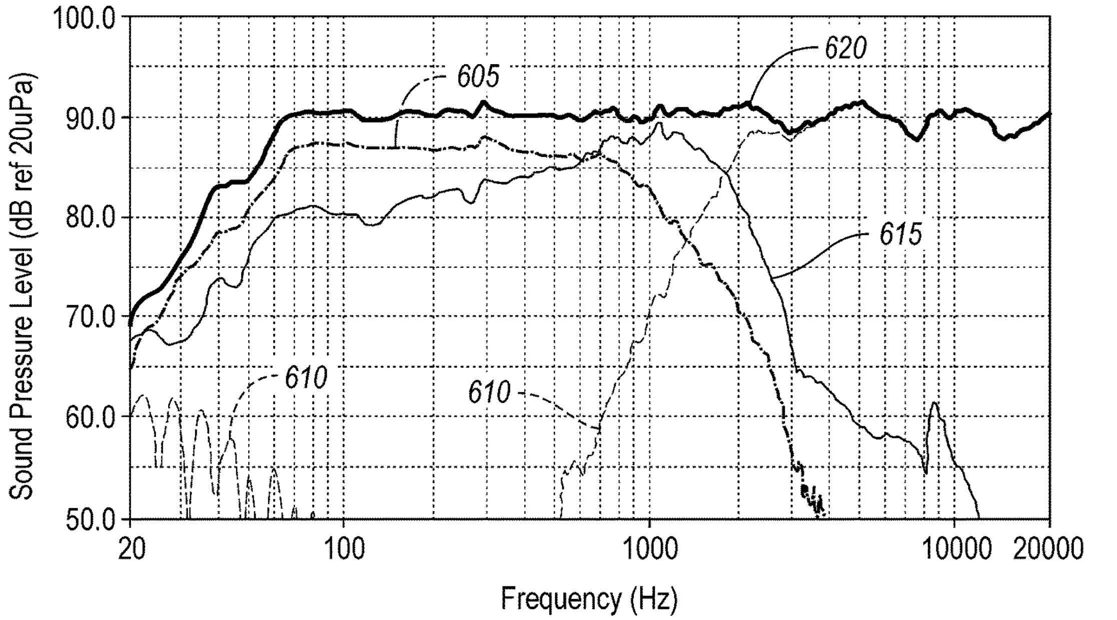
FIG. 6 depicts a plot including waveforms corresponding to various frequency responses in accordance to one embodiment.
Figure 7:
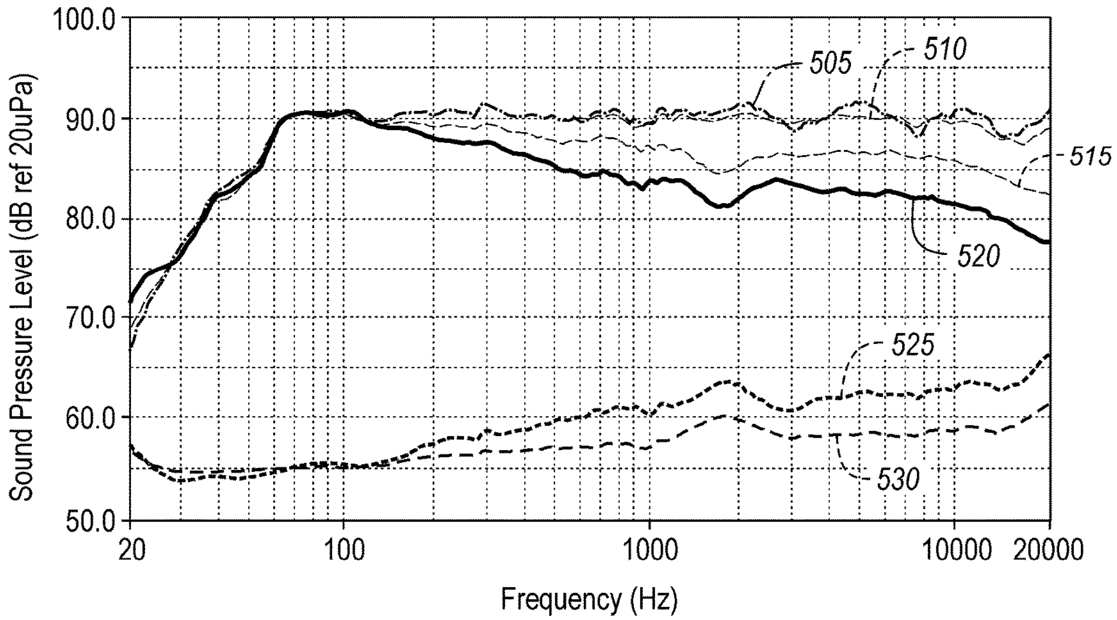
FIG. 7 depicts a plot including waveforms corresponding to various acoustic spin curves in accordance to one embodiment.

FIG. 6 depicts a plot including waveforms corresponding to various frequency responses in accordance to one embodiment. Specifically, FIG. 6 illustrates an overall frequency response 620 of the speaker system 100, a tweeter crossover response 610, a first woofer response 615, and a second and third woofer response 605. As evident by the first woofer response 615, the first woofer 110*a* realizes a crossover at approximately 500 Hz with the tweeter 110*d*, and at approximately 1500 Hz with the second and third woofers 110*b*, 110*c*. This plot illustrates that the first woofer 110*a* realizes that the input current is nearly equivalent to that of an output current. Further, the overall frequency response 620, or sum, is relatively flat, illustrating FIG. 7 depicts a plot including waveforms corresponding to various acoustic spin curves in accordance to one embodiment. Specifically, FIG. 7 illustrates a spin curve for each of an on-axis curve 505, a window curve 510, a first reflection curve 515, a total sound power curve 520, a total sound power DL 525, and a first reflection DL 530. As shown, the window curve 510 is relatively flat. This may be in response to a larger cone area of the first woofer 110*a* over that of a traditional mid-range speaker which has a smaller cone area.

Accordingly, a speaker system implementing a woofer in place of a midrange speaker is provided. The woofer may operate as a midrange speaker at least in part due to a high current and low impedance of a filter configured to drive the woofer. Further, any high impedances recognized in response to the woofer may be balanced by the low impedance of the remaining woofers.

The embodiments of the present disclosure generally provide for a plurality of circuits, electrical devices, and at least one controller. All references to the circuits, the at least one controller, and other electrical devices and the functionality provided by each, are not intended to be limited to encompassing only what is illustrated and described herein. While particular labels may be assigned to the various circuit(s), controller(s) and other electrical devices disclosed, such labels are not intended to limit the scope of operation for the various circuit(s), controller(s) and other electrical devices. Such circuit(s), controller(s) and other electrical devices may be combined with each other and/or separated in any manner based on the particular type of electrical implementation that is desired.

It is recognized that any controller as disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof) and software which co-act with one another to perform operation(s) disclosed herein. In addition, any controller as disclosed utilizes any one or more microprocessors to execute a computer-program that is embodied in a non-transitory computer readable medium that is programmed to perform any number of the functions as disclosed. Further, any controller as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware based inputs and outputs for receiving and transmitting data, respectively from and to other hardware based devices as discussed herein.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

The invention claimed is:

1. A speaker assembly, comprising:

a first woofer speaker electronically coupled to a first electronic circuit including a high-Q filter configured to provide first audio signals having frequencies between 200-2000 Hz to the first woofer speaker; and at least one second woofer speaker electronically coupled to a second electronic circuit configured to provide second audio signals having frequencies between 20-200 Hz to the at least one second woofer speaker, wherein the first woofer speaker is identical to the at least one second woofer speaker and is configured to operate as a mid-range speaker, wherein the second electronic circuit has a higher impedance than the first electronic circuit so that an overall impedance of the speaker assembly is balanced.

2. The assembly of claim 1, wherein the high-Q filter includes an inductor having an inductance that lowers an impedance of the first audio signals.

3. The assembly of claim 2, wherein an inductor of the second electronic circuit has a higher inductance value than that of the inductor of the high-Q filter.

4. The assembly of claim 2, wherein the inductor has an inductance of 1.3 mH.

5. The assembly of claim 1, wherein the high-Q filter includes a capacitor having a capacitance of approximately 14 μF.

6. The assembly of claim 1, wherein the at least one second woofer speaker includes a pair of woofer speakers identical to the first woofer speaker.

7. The assembly of claim 1, wherein the first woofer speaker and the at least one second woofer speaker are the same mechanical part.

8. The assembly of claim 1, wherein the first woofer speaker has a same cone size as the at least one second woofer speaker.

9. The assembly of claim 1, wherein the first woofer speaker and the at least one second woofer speaker have a same sensitivity.

10. A three-way speaker system, comprising:

three identical woofer speakers including a first woofer speaker, a second woofer speaker, and a third woofer speaker, the first woofer speaker electronically coupled to a first filter configured to provide a first audio signal having mid-range frequencies between 200-2000 Hz, and the second woofer speaker and the third woofer speaker each coupled to a second filter configured to provide the second woofer speaker and the third woofer speaker with a second audio signal having frequencies between 20-200 Hz, wherein the second filter has a higher impedance than the first filter so that an overall impedance of the speaker system is balanced.

11. The system of claim 10, wherein the first filter is a high-Q filter.

12. The system of claim 10, wherein the first filter is a narrow-band filter.

13. The system of claim 10, wherein the first filter includes an inductor having an inductance of approximately 1.3 mH.

14. The system of claim 10, wherein the first filter includes a capacitor having a capacitance of approximately 14 μF.

15. The system of claim 10, further comprising a crossover electronically coupled with the three-identical woofer speakers and an amplifier electronically coupled to the crossover.

16. The system of claim 10, wherein the three identical woofer speakers are the same mechanical part.

17. The system of claim 10, wherein the three identical woofer speakers have identical cone sizes.

18. The system of claim 10, wherein the three identical woofer speakers have identical sensitivities.

* * * * *